(12) United States Patent
Kimmig et al.

(10) Patent No.: US 11,815,543 B2
(45) Date of Patent: Nov. 14, 2023

(54) ASSEMBLY FOR CHECKING THE FUNCTIONALITY OF A MEASURING OBJECT

(71) Applicant: Neuroloop GmbH, Freiburg (DE)

(72) Inventors: Fabian Kimmig, Freiburg (DE); Tim Boretius, Freiburg (DE); Daniel Kempter, Freiburg (DE); Janosch Dobler, Freiburg (DE); Christian Goslich, Freiburg (DE)

(73) Assignee: NEUROLOOP GMBH, Freiburg (DE)

( * ) Notice: Subject to any disclaimer, the term of this patent is extended or adjusted under 35 U.S.C. 154(b) by 0 days.

(21) Appl. No.: 17/763,764

(22) PCT Filed: Oct. 1, 2020

(86) PCT No.: PCT/EP2020/077481
§ 371 (c)(1),
(2) Date: Mar. 25, 2022

(87) PCT Pub. No.: WO2021/064087
PCT Pub. Date: Apr. 8, 2021

(65) Prior Publication Data
US 2022/0341988 A1    Oct. 27, 2022

(30) Foreign Application Priority Data
Oct. 1, 2019 (DE) .................... 10 2019 215 126.4

(51) Int. Cl.
*G01R 31/28* (2006.01)
*G01R 31/319* (2006.01)

(52) U.S. Cl.
CPC ... *G01R 31/2808* (2013.01); *G01R 31/31905* (2013.01)

(58) Field of Classification Search
CPC .............. A61B 5/05; A61B 2090/064; A61B 2560/0214; G01R 1/0408; G01R 31/2808;
(Continued)

(56) References Cited

U.S. PATENT DOCUMENTS 6,553,260 B1 * 4/2003 Skoldengen ....... A61N 1/37254
607/32
6,567,703 B1 * 5/2003 Thompson ........... A61N 1/3758
607/36
(Continued)

FOREIGN PATENT DOCUMENTS

CN    107064776 A    8/2017
CN    109143028 A    1/2019
(Continued)

OTHER PUBLICATIONS

International Search Report or PCT/EP2020/077481 dated Dec. 18, 2020; 13 pages.

*Primary Examiner* — Vinh P Nguyen
(74) *Attorney, Agent, or Firm* — Fitch, Even, Tabin & Flannery LLP

(57) ABSTRACT

The invention is an assembly for checking the functionality of a measuring object, that is a DUT, in a medical implant or at least one part of the medical implant. The assembly comprises a test signal generator, a test module that is connected to the test signal generator. The assembly has a first receiving structure with at least one contact electrode, into which an adapter rigidly connects to the DUT in a releasable manner which is inserted to form least one electrical contact. A control and analysis unit is connected to the test signal generator and to the test module in a wired or wireless manner.

17 Claims, 4 Drawing Sheets

(58) Field of Classification Search
CPC .............. G01R 31/31905; G01R 23/02; G01R 33/032; G01R 33/26; G01R 31/3648; G01R 33/288; G01N 33/48785; G01D 21/00; H01Q 1/2291; H02J 2310/23; H04W 52/0216; H04W 52/0229; H04W 12/06; H10N 30/30

See application file for complete search history.

(56) References Cited

U.S. PATENT DOCUMENTS

| | | | | |
|---|---|---|---|---|
| 7,688,077 | B2* | 3/2010 | Miyauchi | G01R 31/2822 324/756.07 |
| 7,881,801 | B2* | 2/2011 | Carter | G01R 31/2839 607/57 |
| 9,423,420 | B2* | 8/2016 | Panagas | H04M 1/24 |
| 9,588,173 | B2* | 3/2017 | Isaac | G01R 1/24 |
| 9,623,256 | B2* | 4/2017 | Moazen | A61N 1/36125 |
| 9,851,377 | B2* | 12/2017 | Tay | G01R 1/0408 |
| 10,088,521 | B2* | 10/2018 | Yun | G01R 31/3025 |
| 10,877,066 | B2* | 12/2020 | Sterzbach | G01R 1/045 |
| 2002/0079912 | A1 | 6/2002 | Shahriari et al. | |
| 2004/0010388 | A1 | 1/2004 | Ahrikencheikh et al. | |
| 2007/0005118 | A1 | 1/2007 | Carter et al. | |
| 2018/0031629 | A1 | 2/2018 | Yun et al. | |

FOREIGN PATENT DOCUMENTS

| | | |
|---|---|---|
| CN | 109975640 A | 7/2019 |
| DE | 202006000739 U1 | 4/2006 |
| DE | 102014014943 A1 | 4/2016 |
| EP | 1990898172 A1 | 2/1999 |
| WO | 2015069522 A1 | 5/2015 |

* cited by examiner

ASSEMBLY FOR CHECKING THE FUNCTIONALITY OF A MEASURING OBJECT

CROSS-REFERENCE TO RELATED APPLICATIONS

Reference is made to PCT/EP2020/077481 filed Oct. 1, 2020, designating the United States, and German Application No. 10 2019 215 126.4 filed Oct. 1, 2019, which are incorporated herein by reference in their entirety.

BACKGROUND OF THE INVENTION

Field of the Invention

The invention relates to an assembly for checking the functionality of a measuring object, known as a DUT (Device Under Test), in the form of a medical implant or at least one part of the medical implant.

Description of the Prior Art

Implantable medical devices used for electrical stimulation of local intracorporeal areas, in short implantable pulse generators (IPG), for example for cardiac defibrillation, pacemaker and resynchronization applications, for neurostimulation measures, such as spinal cord stimulation, brain stimulation or vagus nerve stimulation to name but a few, generally comprise a fluid-tight enclosed housing containing components for electrical pulse generation, at least one electrical energy source in the form of a battery or an induction coil, and an electrical circuit structure connected thereto. In addition, in most cases, adjoining the housing is a head part, which contains an electrical contact assembly which is connected to the energy source and the electrical circuit structure, and into which can be inserted a fluid-tight plug assembly ending with the head part which is in contact with electrical inlet and outlet lines for the intracorporeal local application of the electrical stimulation signals as well as, if applicable to supply intracorporeal, locally picked up electrical signals to the electrical circuit structure in the housing.

With an increasing range of functions of the medical implant, there is also an increase in the number of at least one of electrical and electronic components incorporated within the implant, which, due to minimal space requirements, are arranged tightly packed and wired to each other in a complex manner on at least one printed circuit board. The electrical energy necessary for operating the medical implant is provided either by a battery integrated within the implant or by way of inductive energy transmission.

Both for the development and manufacturing of implants and quality control and assurance in the production of large numbers of medical implants, verification and control procedures are indispensable. In order to rule out the carrying over of faults occurring during the production process, metrological examinations are carried out on function-determining components during the entire production process, in each case at different stages of completion of a medical implant. Of particular relevance in connection with this are the reproducibility and protocol compliance of the individual function tests.

US published patent application 2018/9931629 A1 discloses a test assembly for testing the functionality of a semiconductor assembly, in which the semiconductor assembly to be examined is arranged in a test socket to which test signals are wirelessly applied.

US published patent application 2002/0079912 A1 discloses a test assembly for electrical printed circuit boards, which for testing purposes can be placed in a test socket which electrical test signals can be applied.

DE 20 2006 000 739 U1 discloses a device for testing electronic components, more particularly components with integrated circuits, with a contact base into which a component to be tested can be brought into contact.

SUMMARY OF THE INVENTION

The invention is an assembly for testing the functionality of a measuring object, preferably in the form of a medical implant or at least a part of a medical implant to provide functional tested finished products, preferably medical implants, or parts thereof, which are produced both in small batches and also on an industrial scale, can be carried out safely, reliably and with durable reproducibility and which are also protocol-compliant in order to satisfy guarantee requirements.

The assembly according to the invention checks the functionality of a measuring object that is preferably in the form of a medical implant, or at least a part of a medical implant and hereinafter is referred to as the DUT, which essentially comprises a test signal generator, a test module, an adapter module insertable into the test module and a control and analysis unit.

The test signal generator, which is preferably connected to the test module via an interface, generates the test signals for checking the DUT which are transmitted directly to the DUT via the test module. Suitable in principle are test signal generators that are known per se, with fixed or freely selectable predeterminable electrical test signals. Depending on the type and purpose of use of the DUT to be checked, the test signal generator can, for example, replicate ECG signals or generate electrical signal forms that correspond to neuronal electrical signals. Preferably suitable is a test signal generator for producing electrical voltages with any predeterminable time course and a periodic recurrence, which is also individually predeterminable. Preferable test signal generators are, for example, analog or digital function generators.

In a simplest form of embodiment, the test module, which is connected to the test signal generator preferably via a connection cable, comprises a first receiving structure with at least one, but preferably a plurality of contact electrodes, into which an adapter rigidly is releasably connected to the DUT to be by insertion to form at least one electrical contact.

The test module comprises a housing, in which a first receiving structure, which preferably is a recess within the housing, into which the adapter module is rigidly connected to the DUT in a releasable manner that can be inserted and form an interlocking connection. The interlocking connection formed by inserting the adapter module into the first receiving structure ensures a one-to-one fit of the adapter module within the first receiving structure and therefore also of the DUT relative to the first receiving structure of the test module. At the same time, an electrical connection is created between at least one contact electrode applied in the area of the recess of the receiving structure and the adapter module.

In addition to the interlocking connection, the adapter module is optionally fixed to the test module by way of an additional frictional connection, for example through the provision of a spring-loaded clamping or latching connection between the adapter module and test module. Alternative holding measures can of course also be provided directly or indirectly on the test module, which can rigidly spatially fix the adapter module relative to the test module in a releasable manner.

By providing the first receiving structure within the test module, it is ensured that identically or differently designed DUTs are each insertable into an adapter module that is individually adapted to the DUT and can be used in the uniformly designed receiving structure, which can be tested under exactly the same test conditions, so that in each case maintaining a defined spatial position and electrical contact is achieved. In this way, reproducible, reliable checking statements can be made about the DUT.

Hence, one and the same test module is available for testing differently assembled DUTs which are each used in an adapter module which is individually matched to the respective DUT and can in turn be inserted into the first receiving structure of the test box.

To conduct a check of a DUT that is connected to an adapter module by insertion into the first receiving structure, the test signals generated by the test generator are transmitted via the test module and the adapter module to the DUT. For this purpose, depending on the number and arrangement of the electrical contact points applied to the DUT, which are hereinafter referred to as counter-electrodes having at least one contact surface, via which the test signals, and optionally also the measuring signals, can be transmitted between the test module and the DUT with corresponding contact electrodes having at least one contact surface being provided on the adapter module side.

A control and analysis unit, which is directly or indirectly connected to the test signal generator as well as the test module, is used for testing and analysing the recorded measuring signals. The connection can be wired or wireless, and in the first instance serves to transmit control and measuring signals between the individual components. The control and analysis unit is typically configured in the form of a computer or PC which has all the components and peripheral devices, such as a memory, monitor etc. required for analysing and logging the measuring signals.

In a further embodiment, the test module comprises a second receiving structure which is arranged in a spatially fixed manner in relation to the first receiving structure and into which an electrical additional component, for example an induction coil or signal antenna assembly, that is in contactless interaction with the DUT for the purpose of at least one of electrical energy and signal transmission, can be inserted.

In the case of a DUT that comprises at least one of an induction coil device and an antenna assembly, with the aid of the electrical additional component inserted into the second receiving structure, the functional capacity of at least one of the contactless energy and signal transmission between the DUT and an external coil and antenna unit can be checked. For this, the second receiving structure is preferably designed in the form of a drawer-like recess within the test module and is arranged directly below the first receiving structure in order to thereby ensure a defined relative position between the DUT arranged within the first receiving structure and the electrical additional component placed within the second receiving structure.

Additionally, or alternatively to the connection of the control and analysis unit to the test module, a preferred embodiment has a wired connection between the electrical additional component and the control and analysis unit, along which electrical energy can flow for supplying energy to the DUT, and also the transmission of the measuring signals picked up by the DUT and forwarding to the control and analysis unit can take place.

In order to ensure that the electrical additional component is implemented in a spatially fixed manner within the second receiving structure, the inner contour of the preferably drawer-like second receiving structure and a housing encompassing the electrical additional component, are each counter-contoured with regard to each other so that reliable insertion and fixing of the electrical additional component within the second receiving structure, forming an interlocking connection, that can be optionally supplemented with an additional frictional connection, becomes possible.

In the checking of a medical implant during the course of manufacturing, the DUT typically goes through the following different structural forms:

a) A first stage of checking involves testing printed circuits boards fitted with electronic and electrical components in order to assure the functioning of all electrical/electronic components and to rule out possible cold soldering points.

b) In a manufacturing process following on from this, electrical conductors are electrically connected to contact points provided on the printed circuit board and, for the purpose of spatially defined fixing relative to each other, are fixed relative to each other with a so-called grommet plate.

c) In a further processing step, the electrical conductor structures are brought into contact with an electrical contact assembly, which d) in a final completion stage of the medical implant within a so-called head section is part of an electrical contact structure, for purposes of contacting a cable connection leading away from the medical implant, via which electrical stimulation signals can be applied to an electrode assembly intracorporeally located separately from the medical implant.

In each of the above-mentioned manufacturing stages, different DUTs are present, for the checking of which the first receiving structure within the test module would have to be adapted on an individual DUT basis in order to create a reproducible test situation in each case.

The test module according to the invention is designed with a uniform first receiving structure into which the adapter modules, each designed to match the first receiving structure, can be inserted, which each have a third receiving structure which is individually adapted to a DUT to be checked. Otherwise, the rest of the assembly, relating to the test generator, the test module, the electrical additional components as well as the control and analysis unit remains unchanged. The only measure to be taken for checking differently designed DUTs, relates to the modular exchanging of different adapter modules which each have individual DUT-tailored third receiving structures.

For the purpose of electrical contacting of the DUT within the first receiving structure of at least one of the test module and within the third receiving structure of an adapter module in each case, the respective receiving structures have at least one contact surface on which at least one contact electrode is arranged which can be brought into contact with the DUT in a frictional and interlocking manner by way of a counter contact-electrode located on the DUT side.

Depending on the number, the spatial application and orientation of the contact-electrodes provided on the DUT side, the contact electrodes to be provided on the at least one contact surface should be designed in a suitable manner, to be counter-contoured in each case. In a preferred form of embodiment, the at least one contact electrode and counter-electrode is configured in the manner of a plug and socket contact structure. Alternatively, or in combination, at least one of the contact electrodes and the contact-electrodes can be designed in the form of spring-loaded, deflectably born contact pins. Other, alternative, contact electrodes and other electrode forms and structures are entirely conceivable.

For checking a finished medical implant formed as an implantable pulse generator (IPG) that typically comprises a supply part with electrical/electronic components contained therein as well as a head part attachable thereto with at least one electrical socket structure, the implant is inserted into a first receiving structure adapted in terms of shape and size within the test module or a third receiving structure within an adapter module. By way of the insertion procedure, on electrically accessible contact areas along the contact electrodes provided within the plug and socket structure, the medical implant comes into contact with suitable contact electrodes provided on the test module or adapter module. Through the precisely pre-determined spatial allocation between the implant and the electrical additional component also integrated within the test module, the implant is supplied with electrical energy in a contactless manner. By way of the electrical contacts produced in the socket structure between the implant and test module or adapter module, the test signals generated by the test signal generator are applied to the medical implant. The measuring signals required for testing the functionality and logging the proper functioning are read out in a contactless manner via the additional electrical component arranged within the second receiving structure and supplied to the analysis and control unit.

In addition to the use of the assembly according to the invention for checking functionality of the test component, the test assembly according to the invention is also suitable for updating the medical implant as part of a software update, especially as signal transmission between the additional electrical component and the medical implant can also take place in the direction of the medical implant. For this, the analysis and control unit, has to be supplied with an additional current component in the form of electrical data signals supplied to the additional electrical component. The data signals are transmitted in a contactless manner by way of inductive coupling to the medical implant in which the information can be received in a suitably provided DUT specific storage and computing unit and processed accordingly.

The assembly according to the invention makes possible reliable and reproducible checking of medical implants. On the basis of the modular building-block principle, through the provision of a differently designed at least one of adapter and test modules that are each matched to different DUT configurations, the entire manufacturing history of a medical implant can be monitored and logged. In this way, quality assurance is significantly improved during the production of medical implants.

The assembly for checking functionality according to the invention also allows the checking of at least one DUT at a time to be carried out automatically, especially as all components and manipulation steps required for undertaking functional checking can be implemented by a suitably equipped robot.

BRIEF DESCRIPTION OF THE INVENTION

As an example, the invention will be described below, without restricting the general inventive concept, by way of examples of embodiment with reference to the drawings.

DETAILED DESCRIPTION OF THE INVENTION

Figure 1:
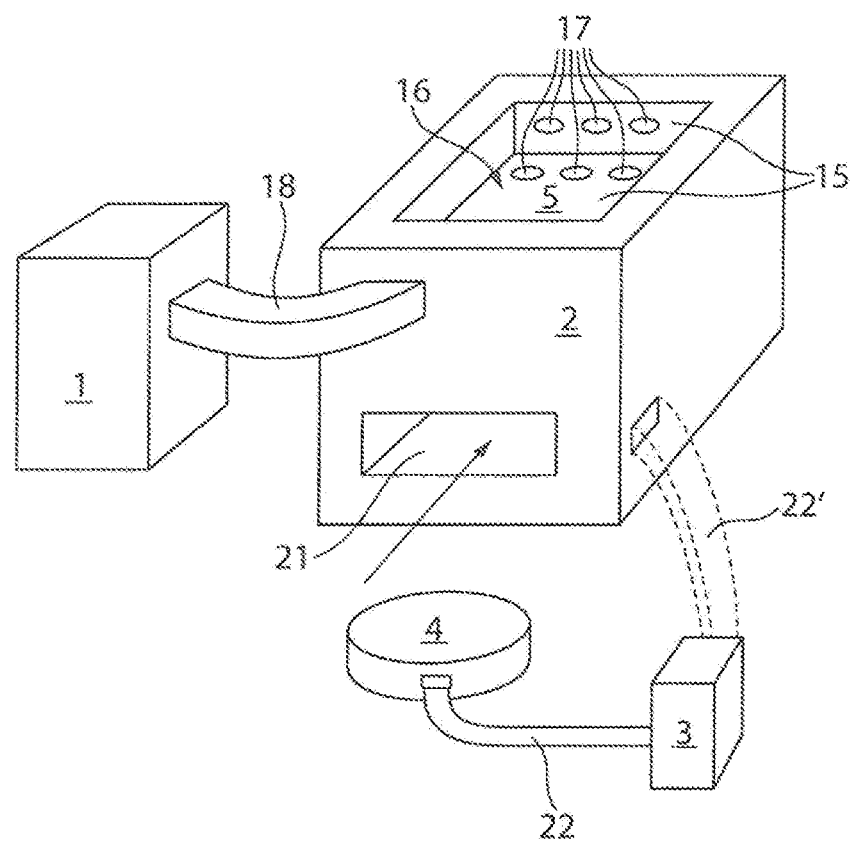
FIG. 1 shows an overview of an assembly for checking functionality.

FIG. 1 shows an overall view of an assembly for checking the functionality of a measuring object, DUT (Device Under Test) comprising a test signal generator 1, a test module 2, a control and analysis unit 3, which is connected to the test module 2 by way of an additional electrical component 4, for the purpose of energy and signal exchange. The core element is the test module 2, which comprises a first receiving structure 5, into which a DUT to be checked can be directly or indirectly rigidly inserted and electrically contacted in a releasable manner.

Figures 2A, 2B:
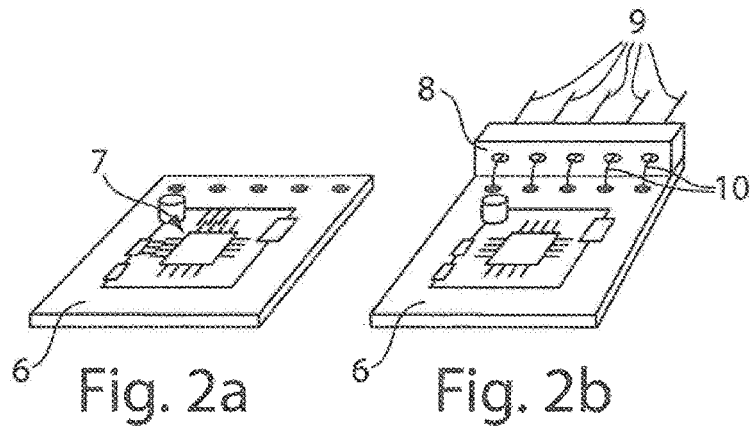
FIG. 2 shows different embodiments of a DUT.
Figures 2C, 2D:
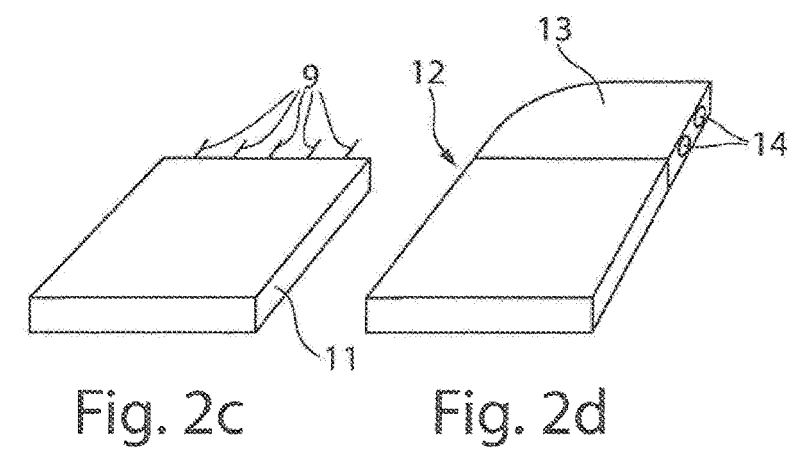

The assembly according to the invention is for checking the functionality and assuring the quality of a medical implant during and after its manufacturing. Illustrated in FIG. 2 are typical DUTs, showing a medical implant in different manufacturing forms. FIG. 2a shows a first manufacturing stage for the assembly of a medical implant in the form of an electrical circuit board 6 with electrical/electronic components 7 arranged thereon. FIG. 2b shows a subsequent second expansion stage, with a grommet plate 8, through which the electrical conductors 9 are fed and fixed and are each at one end connected to contact points 10 on the circuit board 6. FIG. 2c shows an enclosure 11, which surrounds the circuit board 6 as well as the grommet plate 8, preferably in a fluid-tight manner. Preferably the enclosure 11 is formed as a hardened epoxy resin mass or metal housing, e.g. titanium housing. FIG. 2d shows a finished medical implant 12 that also has a head part 13 which in the example embodiment comprises two sockets 14 which may be for receiving a counter contact along which contact electrodes are arranged that are connected to the electrical conductors 9. Plugs that end in a fluid-tight manner with the head part 13 are connected with intracorporeally located electrodes which are inserted into the sockets 14.

For checking the functionality of the individual expansion stages of a medical implant 12 in accordance with the differently designed DUT illustrated in FIGS. 2a to d, the test module 2 shown in FIG. 1 has a first receiving structure 5, contained in a recess 16 within the test module 2 with at least one contact surface 15 and contact electrodes 17 arranged thereon.

To carry out the measurement, for example of the circuit board illustrated in FIG. 2a as the DUT, test signals, for example ECG signals are generated by the test signal generator 1. A cable connection 18 running between the test signal generator 1 and the test module 2 transmits the ECG signals to the DUT which are arranged indirectly in the first receiving structure 5 by an adapter module.

Figure 4:
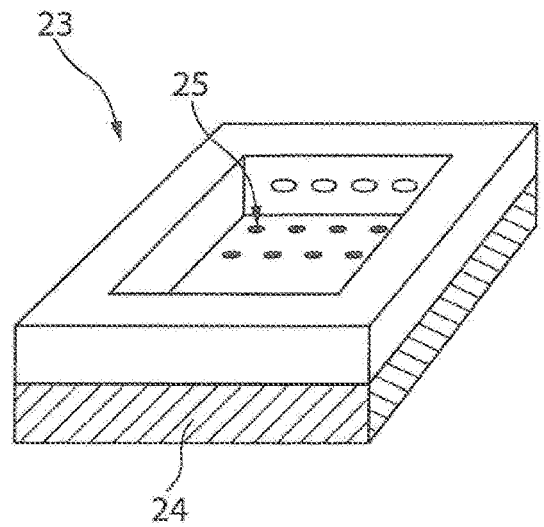
FIG. 4 shows an adapter module.

For this, the receiving structure 5 provided in the test module 2, is designed so that adapter modules 23, have surfaces matched in a counter-contoured manner to the first receiving structure 5, is inserted as shown in FIG. 4. Every adapter module 23 has a uniform joining contour 24 for insertion and electrical contact within the first receiving structure 5 of the test module 2. Depending on the DUT to be checked, each adapter 23 has differently finished third receiving structures 25. The DUTs, which are different in shape and size, can always be inserted into respective third receiving structures 25 in an interlocking manner, and, if necessary, also be frictionally fitted. The DUTs are contacted with contact electrodes 25 suitably provided on the adapter module 23.

Figure 3:
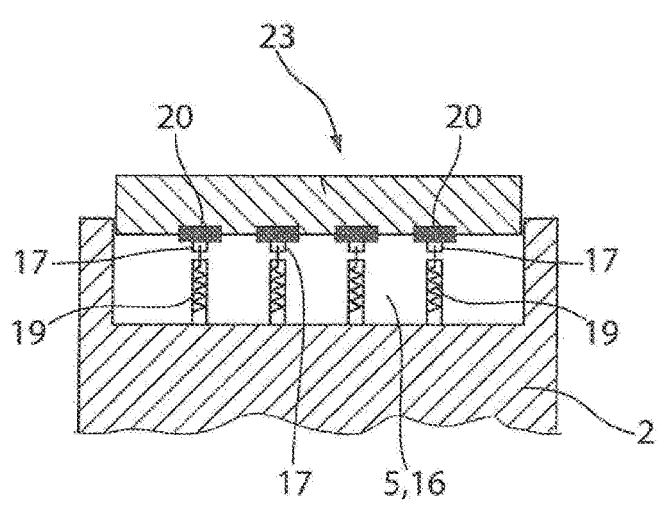
FIG. 3 shows a receiving structure with spring-loaded contact pins.

For making electrical contact of the adapter module spatially fixed within the first receiving structure 5, at least some of the contact electrodes 17 provided within the recess 16 come into electrical contact with counter contact-electrodes 20 present on the adapter module. FIG. 3 shows a possible implementation of the contact electrodes 17 arranged on the test module 2 in the form of spring-loaded contact pins 19, which contact the counter-electrodes 20 on the underside of the adapter module 23.

Depending on the electrical component configuration of the DUT, the test signal generator 1 also supplies electrical energy to the DUT to be checked via the cable connection 18.

The test module 2 also comprises a second receiving structure 21 configured as a drawer-like recess as shown in FIG. 1 into which the additional electrical component 4, which preferably is one of an induction coil and antenna arrangement, via which electrical energy and measuring signals can be contactlessly transferred.

Optionally, the control and analysis unit 3 is directly connected to the test module 2. See cable connection 22', or the electrical additional component 4 in FIG. 1. See cable connection 22 in FIG. 1. Via the respective cable connection 22, 22' in FIG. 1, the measuring signals are picked up by the contact electrodes 17 and transmitted to the control and analysis unit 3. Also, the DUT can be supplied with electrical energy via the cable connection 22, 22'.

Figure 5:
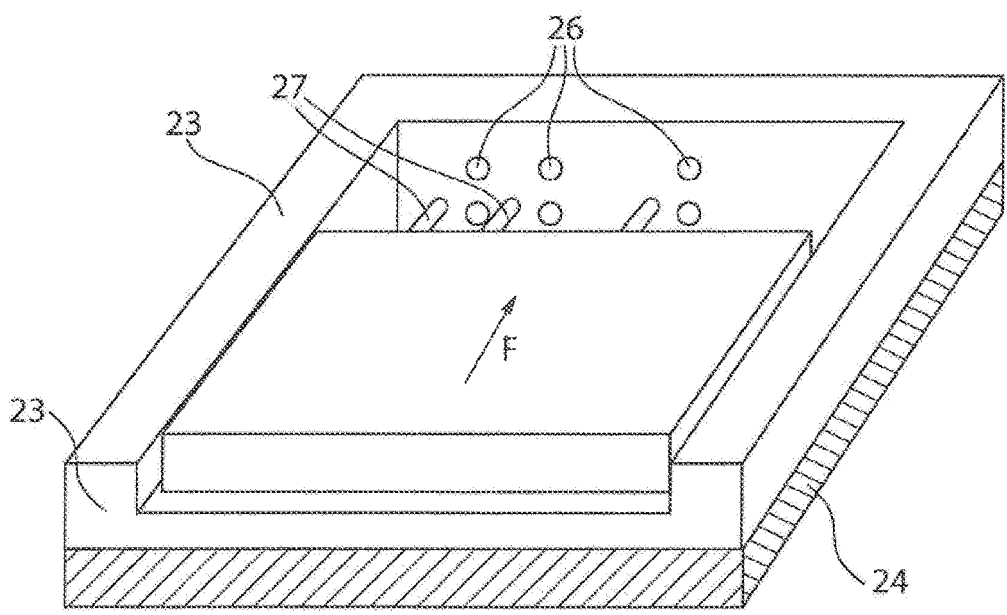
FIG. 5 shows a receiving structure with socket contacts.

For the purpose of making electrical contact with the DUT within an adapter module 23, there are, for example, at least one of the spring-loaded contact pins 19 illustrated in FIG. 3 and the contact electrodes, each in the form of a socket connection as shown in FIG. 5. FIG. 5 shows an adapter module 23, comprising socket contacts 25 shown in FIG. 4, into which the plug contacts 27 of a DUT can be inserted. The third receiving structure 25 of the adapter module 23 makes force-actuated insertion possible of the DUT into the adapter module 23 in the force direction F.

Figure 6A:
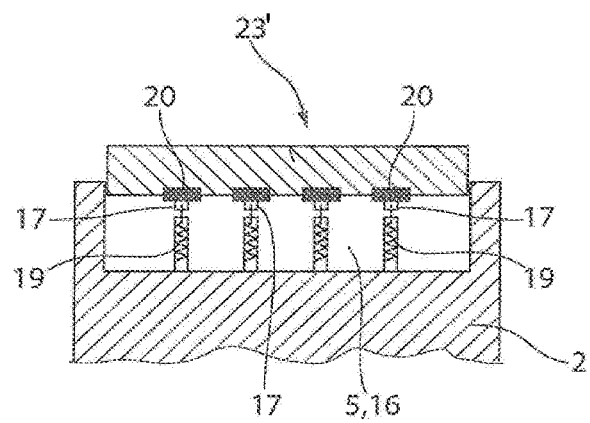
FIGS. 6a and 6b shows duplication of the receiving structure of FIG. 3 which is used for testing multiple DUTs.
Figure 6B:
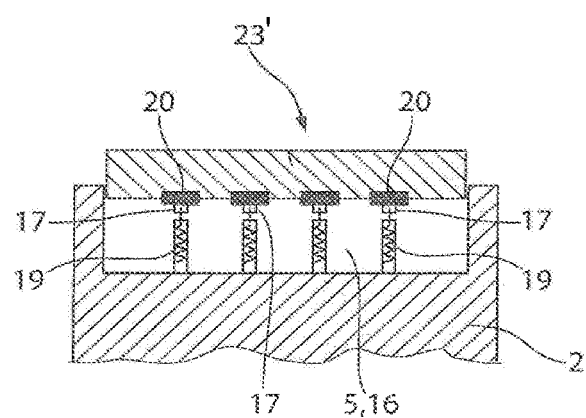

FIG. 6 illustrates the receiving structure for testing two DUTs. The test module is suitably modified to perform dual testing.

In principle, no limits are set on the forms of embodiment for producing both the first and the third receiving structure 5, 25.

LIST OF REFERENCE NUMBERS

1 Test signal generator
2 Test module
3 Control and analysis unit.
4 Additional electrical component
5 First receiving structure
6 Electrical circuit board
7 Electrical/electronic component
8 Grommet plate
9 Electrical conductors
10 Contacts
11 Enclosure
12 Medical implant
13 Head part
14 Socket
15 Contact surface
16 Recess
17 Contact electrodes
18 Cable connection
19 Contact pin
20 Contact-counter electrode
21 Second receiving structure
22, 22' Cable connection
23 First adapter module
23' Second adapter module
24 Joining contour
25 Third receiving structure
26 Socket
27 Plug contact pin

The invention claimed is:

1. An assembly for testing functionality of a DUT (Device Under Test) comprising a medical implant or a part thereof comprising:
   a) a test signal generator;
   b) a test module connected to the test signal generator comprising a first receiving structure including at least one contact electrode into which an adapter is rigidly and releasably connected to the DUT by insertion into the first receiving structure to form at least one electrical contact between the at least one contact electrode and the DUT; and
   c) a control and analysis unit, connected to the test signal generator and the test module by a wireless or wired connection; and wherein
   the test module comprises a second receiving structure spatially fixed from the first receiving structure and an additional electrical component which is inserted into the second receiving structure to provide contactless interaction with the DUT which supplies at least one of electrical energy and signal transmission to the DUT.

2. An assembly according to claim 1, wherein the additional electrical component comprises at least one of an induction coil and a signal antenna.

3. An assembly according to claim 2, wherein the control and analysis unit is either a wireless or a wired connection to the additional electrical component.

4. An assembly according claim 2, wherein the first receiving structure comprises at least one contact surface which contacts the adapter and on which at least one electrode comprising a contact is located and when the adapter is inserted into the first receiving structure, the module is interlocked in frictional contact with the at least one contact electrode of the adapter.

5. An assembly according to 1, wherein the control and analysis unit is connected with the additional electrical component by a wireless or a wired connection.

6. An assembly according to claim 5, wherein the DUT comprises at least one of:
   an electrical circuit board of a medically active implant;
   an electrical circuit board with electrical input and output leads of a medical implant; and
   a medical implant with at least one electrical contact assembly.

7. An assembly according claim 1, wherein the first receiving structure comprises at least one contact surface which is brought into contact with the adapter including at least one counter contact-electrode comprising a contact, which when the adapter is inserted into the first receiving structure, an interlocking or frictional contact is formed with the electrode.

8. An assembly according to claim 7, wherein the adapter comprises a third receiving structure including at least one contact electrode into which the DUT is inserted to form at least one electrical contact between the adapter and the DUT.

9. An assembly according to claim 8, wherein the third receiving structure comprises at least one contact surface configured to contact the DUT and when the DUT is inserted into the third receiving structure, electrical contact is made between the at least the contact surface and the DUT to provide a frictional and an interlocked contact.

10. An assembly according to claim 9, wherein at least one electrode comprises a spring loaded, deflectable contact pin.

11. An assembly according to claim 9, wherein the at least one contact electrode and the at least one counter-electrode is a plug and socket.

12. An assembly according to claim 8, wherein the at least one contact electrode and the at least one counter-electrode is a plug and socket.

13. An assembly according to claim 7, wherein the at least one contact and counter-electrode comprises a plug and socket.

14. An assembly according to claim 1, wherein the DUT comprises at least one of:
    an electrical circuit board of a medically active implant;
    an electrical circuit board with electrical input and output leads; and
    a medical implant with at least one electrical contact assembly.

15. An assembly according to claim 14, wherein the medical implant is an implantable pulse generator.

16. An assembly according to claim 1, wherein the test signal generator generates ECG signals.

17. An assembly according claim 1, wherein the first receiving structure comprises at least one contact surface which contacts the adapter and on which at least one electrode comprising a contact is located and when the adapter is inserted into the first receiving structure, the module is interlocked in frictional contact with the at least one contact electrode of the adapter.

* * * * *